Figure 1:
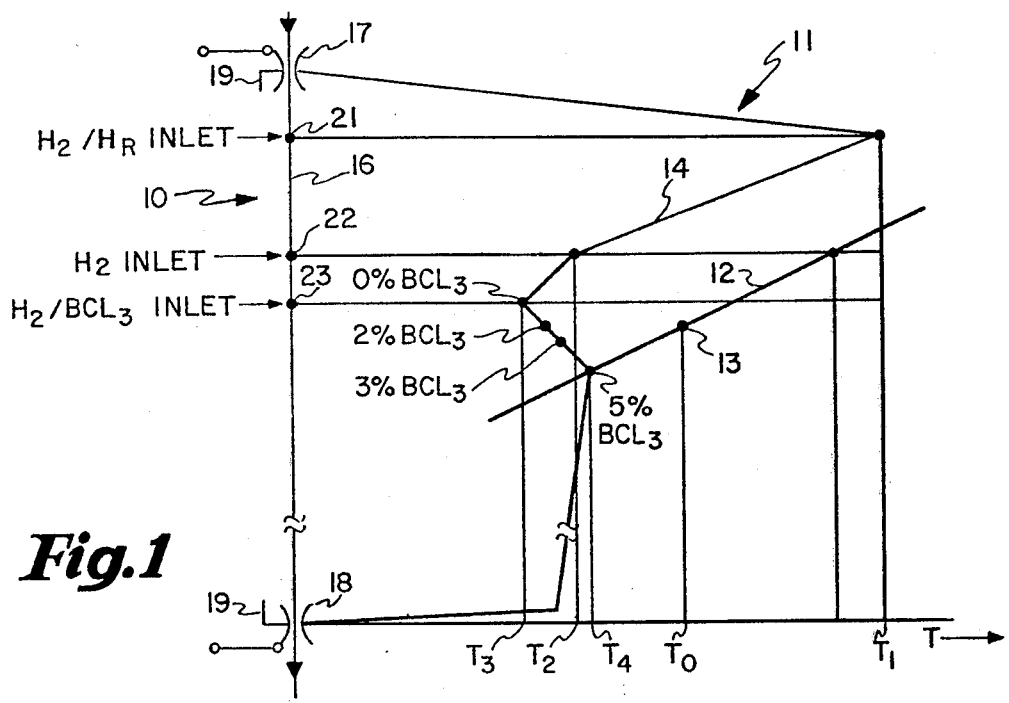

United States Patent [19]
Krukonis

[11] 3,985,917
[45] Oct. 12, 1976

[54] METHOD OF DEPOSITING MATERIAL ON A HEATED SUBSTRATE

[75] Inventor: Val J. Krukonis, Lexington, Mass.

[73] Assignee: Avco Corporation, Cincinnati, Ohio

[22] Filed: Feb. 11, 1974

[21] Appl. No.: 440,092

Related U.S. Application Data

[63] Continuation of Ser. No. 231,358, March 2, 1972, abandoned, which is a continuation-in-part of Ser. No. 4,692, Jan. 21, 1970, abandoned.

[52] U.S. Cl. ................................. 427/52; 427/50; 427/111; 427/117; 427/248 A; 427/249; 427/318; 427/314
[51] Int. Cl.² .................... B05D 3/14; B05D 5/12
[58] Field of Search .......... 427/248, 251, 252, 318, 427/319, 111, 119, 52, 50, 249, 314

[56] References Cited
UNITED STATES PATENTS

| | | |
|---|---|---|
| 2,405,662 | 8/1946 | McManus ........................... 427/249 |
| 2,580,976 | 1/1952 | Toulmin ............................. 427/252 |
| 3,053,636 | 9/1962 | Bean ..................................... 23/209 |
| 3,365,330 | 1/1968 | Hough ............................... 427/111 |
| 3,549,413 | 12/1970 | Candless ........................... 428/389 |
| 3,549,424 | 12/1970 | Rice .................................... 427/248 |

*Primary Examiner*—Michael F. Esposito
*Attorney, Agent, or Firm*—Charles M. Hogan; Abraham Ogman

[57] ABSTRACT

The invention is directed to the deposition of a coating on a substrate by reacting vaporized chemicals on contact with a heated surface to deposit a coating. According to the invention, the deposition surface is cleaned and coated in a single stage reactor. Means are also provided—where a boron deposit is wanted—to deposit an amorphous boron coating on the deposition surface.

10 Claims, 2 Drawing Figures

METHOD OF DEPOSITING MATERIAL ON A HEATED SUBSTRATE

This application is a continuation of Ser. No. 231,358, filed Mar. 2, 1972, now abandoned which is a continuation-in-part of application Ser. No. 4,692, filed Jan. 21, 1970 now abandoned.

A popular method of applying coatings on wires, filaments, and similar deposition surfaces employs a surface heated to candescence. The candescent surface is brought into contact with vaporized chemicals, and the chemicals under the influence of heat react to deposit a coating on the deposition surface.

The vaporized chemicals may be compounds of metals or other elements, alone, or in combination with inert and/or other reacting gases.

In order to form a continuous process the wire or filament or a substrate is generally drawn continuously through a reaction chamber, although the basic process can also be effected on a stationary deposition surface. If the wire, filament, etc., is an electrically conductive medium, such as tungsten or carbon, the wire or filament is passed between electrodes and is heated electrically by passing a current through that portion of the wire or filament within the reaction chamber.

For purposes of this discussion, the term "react" is meant a rearrangement of chemicals either by reaction between reagents or pyrolysis, etc. This discussion principally concerns the deposition of boron on a wire substrate by the reaction of a boron halide, preferably boron trichloride, with hydrogen wherein the halide is reduced on contact with a heated filament and boron deposits on the filament as a coating.

On the other hand, the term "reaction" can also apply to pyrolysis mechanisms, for example, the dissociation of various hydrocarbon substituted chlorosilanes, such as $(Me)SiCl_3$, $(Me)_2SiCl_3$, etc., to form a silicon carbide deposit.

The term reaction can also apply to situations where mixtures of materials are used such as the use of $CH_4$, $BCl_3$ and $H_2$ to form $BC_4$ or the use of $TiCl_4$, $BCl_3$ and $H_2$ to form $TiB_2$.

In the process of depositing a coating on a heated substrate of the type under consideration, it has been found necessary to first clean the deposition surface to remove dirt and lubricating materials or to reduce oxides. In the past, the substrates have been cleaned by passing a candescent filament through a reducing hydrogen atmosphere using a separate stage supplied with its own electrodes. Immediately following the cleaning operation the wire passes through an electrode into a reaction chamber supplied with another pair of electrodes although most frequently the outlet electrode of the cleaning stage is identical to the inlet electrode of the deposition stage.

Two chambers have heretofore been necessary because of gas thermal conductivity considerations since a much higher current is necessary to heat a substrate to candescence in hydrogen or wet hydrogen than is required to heat the substrate in, for example, a stoichiometric mixture of boron trichloride and hydrogen. On the other hand, the current necessary to clean the substrate in the cleaning stage would result in burn-out in the deposition stage.

The purpose of the invention is directed to a process whereby the cleaning and deposition may be accomplished in a single stage reactor, i.e., between one pair of electrodes. In addition to the obvious benefit of simplified equipment, the process is more reliable since electrodes, mercury electrodes in particular, are believed to be at least one cause of internal flaws in the filament which result in breakage during reactor operation.

Another problem solved by the process described herein is the capability of providing substrate cleaning and the deposition of an amorphous boron coating in a single stage.

It is an object of the invention to provide a process whereby it is possible to clean a heated substrate and deposit on the heated substrate surface a coating in a single stage reactor, between one pair of electrodes.

It is another object of the invention to provide an improved process for depositing amorphous boron on a heated filament by the reaction of a boron halide.

It is yet another object of the invention to provide a single stage process for cleaning and depositing an amorphous boron coating on a heated substrate surface from chemical vapors which react on contact with the heated surface.

It is yet another object of the invention to provide a single stage cleaning and deposition process wherein the deposition of a coating on the substrate is started in a specified concentration of reactable vapors.

In accordance with the invention, a method is presented of coating filaments by drawing a heated filament continuously through a reaction chamber. The reaction chamber contains vapors which react on contact with the heated filament to form a desired coating material.

The improvement pertains to the process of cleaning and depositing a coating in a single stage reactor. The process comprises the step of first bringing a substrate to candescence in a reducing or inert atmosphere for the purpose of cleaning the filament. The cleaned portion of the filament then is cooled below the reaction temperature before bringing the filament into contact with the reactable vapors. The cooled filament is brought into contact with reactable vapors only after the vapors have reached a specified concentration in order to avoid forming a crystalline deposit from boron trichloride; the concentration is about 5% boron trichloride by volume at the reaction temperature.

Figure 2:
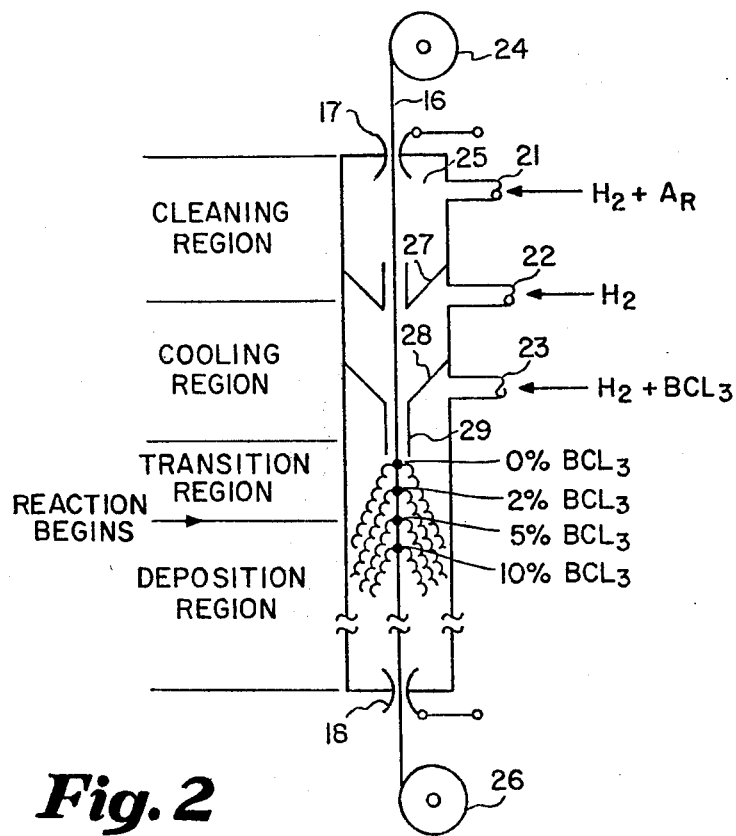

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

FIG. 1 is a schematic representation of a single stage reactor together with a curve useful in describing the operation of the invention; and FIG. 2 is a more detailed schematic representation of a single stage reactor.

Referring to FIG. 1, there is depicted a schematic representation of a single stage reactor 10 together with a curve 11 in which the ordinate represents distance in relation to the length of the reactor and the abscissa represents temperature.

Curve 12 is a typical boron deposition rate curve. In the region to the right of point 13 on curve 12, the reaction of a boron halide on a candescent surface will produce crystalline boron. Point 13 also will vary with the concentration of $BCl_3$ present. There are a number of reasons for this; the primary reason being that the boron atoms deposited on the substrate at temperature about $T_0$ have sufficient mobility to align themselves into a crystalline matrix.

Boron deposited on a surface at temperatures less than $T_0$ will, in general, be amorphous, although it is possible to form crystalline boron below $T_0$ by reducing the deposition rate by means of altered stoichiometry. For example, 1 or 2% $BCl_3$ concentration in hydrogen will result in the formation of crystalline boron at temperatures below $T_0$. The amorphous state is preferred as it produces a coating having greater strength and other preferred properties.

The curve 14 represents the temperature of the filament 16 as the filament progresses downwardly through the reaction chamber.

Referring briefly to the schematic representation 10, there is shown a pair of spaced electrodes 17 and 18. These are coupled to a source of electrical power, preferably DC power as indicated. The limits of the reaction chamber are defined by the brackets 19.

Filament 16 is heated by means of electrical resistance heating in the reaction chamber between the electrodes 17 or 18. The filament 16 enters the reaction chamber through electrode 17. At this point it comes into contact with a cleaning gas stream whose thermal conductivity has been altered by addition of an inert gas. In a single stage reactor of this type the magnitude of current flowing in the filament 16 is determined by the current required to bring the filament to the deposition temperature within the environment containing the vaporized gas which is to be reacted. In the example under consideration, the environmental in which the reaction takes place is to be a stoichiometric mixture of boron, trichloride and hydrogen, although the percentage of $BCl_3$ in relation to hydrogen may be between 20 and 80 volume % for producing amorphous deposits.

Since the thermal conductivity of hydrogen is higher than that of the mixture, it would not be possible to heat the filament sufficiently to clean the filament in the cleaning stage while at the same time maintaining a proper deposition temperature in the deposition stage. Argon, or another inert gas having a lower thermal conductivity, is added to hydrogen for the purpose of providing an overall lower thermal conductivity so that the filament in the cleaning zone can reach a temperature suitable for cleaning the tungsten filament. The $H_2$—Ar ratio is adjusted to bring the filament in the reactor to a temperature between 500° to 1400° C, $T_1$.

The tungsten filament is cleaned in the region of the reactor between $H_2$—Ar inlet 21 and an inlet 22 in which pure $H_2$ is provided. At 22 hydrogen is introduced to the cleaning stage in such an amount to lower the filament temperature to below candescence. The filament temperature decreases from the $H_2$—Ar inlet 21 to the $H_2$ inlet 22 and reaches a temperature $T_2$ at the $H_2$ inlet.

As the filament 16 passes through the high hydrogen concentration environment, the high thermal conductivity of the hydrogen causes the filament to drop in temperature rapidly within a very short distance. The drop in temperature takes place between the $H_2$ inlet and the $H_2$—$BCl_3$ inlet 23. The temperature at the $H_2$—$BCl_3$ inlet 23 is $T_3$, and is well below both the deposition temperature and the temperature at which crystalline boron will deposit out on the filament.

An important consideration at this time is to note that the filament 16 at the $H_2$—$BCl_3$ inlet is in an atmosphere of almost 100% hydrogen. The reactor is designed so that the filament contacts the $BCl_3$ mixture at a very gradual rate. As the amount of boron trichloride increases, the thermal conductivity of the atmosphere drops and the filament begins to heat up once again. The filament 16 reaches the reaction temperature $T_4$ only after it passes through an atmsophere containing at least 5 vol. % $BCl_3$. At temperature $T_2$ in a 5% $BCl_3$—$H_2$ ratio, the boron depositing on the filament is amorphous. Obviously as the filament proceeds towards the exit electrode 18, the $BCl_3$—$H_2$ ratio increases until it reaches stoichiometric. The region of the curve 14 between the $H_2$—$BCl_3$ inlet 23 and the point in the reactor in which the filament comes in contact with 5 percent $BCl_3$ is a region in which the filament increases in temperature from $T_3$ which is a non-reaction temperature to $T_4$, the reaction temperature.

At intermittent points of, for example, 2% $BCl_3$, the filament is at intermediate temperatures, low compared to those required for any appreciable deposition to occur.

Referring to FIG. 2 of the drawings, there is depicted a detailed schematic representation of a single stage reactor for depositing a coating by reacting vaporized chemicals on a heated substrate. FIG. 2 shows once again electrical resistance heating. It is clear that the filament in the reaction chamber may be heated by electromagnetic induction. The technique does not depend on the method used to heat the filament.

The process previously described makes use of gases having different thermal conductivity to control the temperature of the filament along its length. It should be clear that the temperature of the filament may be adjusted by any number of well-known means such as by providing heat reflectors and absorbers in judicially chosen locations along the length of the filament. Further, it is possible to control the temperature of the filament by adjusting the velocity of gas through which the filament flows by constricting or enlarging the passage through which gas is brought into contact with the filament. These techniques are common knowledge and disclosed in other patents and other published literature.

Referring to FIG. 2 of the drawings, tungsten filament, for example, is supplied from a reel 24; the filament 16 passes through electrode 17 down through the length of the reaction chamber 25 and out through an exit electrode 18 to a take-up reel 26. Baffles 27 and 28 are provided to prevent back mixing of gases. The baffle 28 contains a restricted passage 29 in order to assure that the filament entering the deposition zone of the reaction chamber first encounters 0% $BCl_3$ and gradually contacts increasing amounts of $BCl_3$ until the filament reaches the proper reaction temperature in a 5% $BCl_3$ atmosphere.

The broad concept of moving a clean, relatively cool substrate into contact with reactable vapors and simultaneously heating said substrate so as to effect a gradual increase in reactable vapor concentration and substrate temperature was used successfully to produce SiC, $B_4C$ and $TiB_2$ from the materials identified previously. The initial cleaning procedure was also successfully used in these instances.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

I claim:

1. In a method for coating electrically conducting filaments by drawing the filament continuously through an enclosed reaction chamber containing vapors taken from the class consisting essentially of boron halides to produce boron deposit, hydrocarbon substituted chlorosilanes to produce a silicon carbide deposit, a mixture of boron carbide, boron trichloride and hydrogen to form a boron carbide deposit or a mixture of titanium tetrachloride, boron trichloride and hydrogen to form a titanium diboride deposit, said foregoing materials being reactable on contact with a hot surface of the filament to form the desired coating material, the filament being positioned between a single pair of electrodes the improvement comprising passing an electric current through the filament to heat it to a cleaning temperature in excess of that normally used to cause the chemical vapors to react on contact with the surface to form a coating on the surface, exposing a hot surface segment of said filament to a reducing atmosphere for cleaning said filament;
    cooling said cleaned surface segment below the reaction temperature in a non-reactive atmosphere;
    moving said cooled surface segment gradually into contact with the reactable vapors and simultaneously heating said surface segment so as to effect gradual increase in reactable vapor concentration and temperature said surface segment reaching said reaction temperature only after said surface segment is exposed to an atmosphere containing at least a specified proportion of reactable vapors.

2. A method as described in claim 1 in which said filament is tungsten.

3. A method as described in claim 1 in which said filament is tungsten, said reactable vapors are boron trichloride, and said cleaning and reaction temperatures are above 500° C.

4. A method as defined in claim 1 wherein said filament surface segment is drawn sequentially through three gaseous regions in the reaction chamber where the heat conductivity of the gas in each region is adjusted to determine the quantity of heat retained by the filament surface segment.

5. A method as described in claim 4 wherein the surface segment is first brought into a region containing hydrogen and sufficient inert gas with a lower thermal conductivity than hydrogen to maintain a cleaning temperature and then moved into a pure hydrogen atmosphere where said filament is cooled and finally through a mixture of hydrogen and reactable vapors where the proportion of reactable vapors to hydrogen is increased gradually.

6. In a method for coating a substrate by drawing said substrate continuously through an enclosed reaction chamber containing vapors taken from the class consisting essentially of boron halides to produce boron deposit, hydrocarbon substituted chlorosilanes to produce a silicon carbide deposit, a mixture of boron carbide, boron trichloride and hydrogen to form a boron carbide deposit or a mixture of titanium tetrachloride, boron trichloride and hydrogen to form a titanium diboride deposit, said foregoing materials being reactable on on contact with a hot surface of the substrate to form the desired coating material, the substrate being positioned between a single pair of electrodes and heated by current flowing therein at a rate tending to produce a surface temperature at least high enough to cause the chemical vapors to react on contact with the substrate surface to form a coating on the surface, the improvement comprising exposing a segment of said substrate surface to a reducing atmosphere for cleaning said surface;
    cooling said cleaned substrate surface segment below the reaction temperature in a non-reactive atmosphere;
    moving said cooled substrate surface segment gradually into contact with the reactable vapors and simultaneously heating said substrate surface so as to effect gradual increase in reactable vapor concentration and temperature, said substrate surface reaching said reaction temperature only after said substrate surface is exposed to an atmosphere containing at least a specified proportion of reactable vapors.

7. A method as described in claim 6 in which said substrate is tungsten.

8. A method as described in claim 6 in which said substrate is tungsten, said reactable vapors are boron trichloride, and said cleaning and reaction temperatures are above 500° C.

9. A method as defined in claim 6 wherein said substrate surface segment is drawn sequentially through three gaseous regions in the reaction chamber where the heat conductivity of the gas in each region is adjusted to determine the quantity of heat retained by the substrate surface segment.

10. A method as described in claim 9 wherein the surface segment is first brought into a region containing hydrogen and sufficient argon to maintain a cleaning temperature and then moved into a pure hydrogen atmosphere where said filament is cooled and finally through a mixture of hydrogen and reactable vapors where the proportion of reactable vapors to hydrogen is increased gradually.

* * * * *